(12) United States Patent
Kim

(10) Patent No.: US 6,358,811 B1
(45) Date of Patent: Mar. 19, 2002

(54) METHOD FOR FORMING A STOICHIOMETRIC FERROELECTRIC AND/OR DIELECTRIC THIN FILM LAYER CONTAINING LEAD OR BISMUTH ON AN ELECTRODE

(76) Inventor: Bae Yeon Kim, 303-506, Mokdong Shinsigaji Apt., 903, Mok 5-Dong, Yangheon-Gu, Seoul (KR)

(*) Notice: Subject to any disclaimer, the term of this patent is extended or adjusted under 35 U.S.C. 154(b) by 0 days.

(21) Appl. No.: 09/275,558

(22) Filed: Mar. 24, 1999

(30) Foreign Application Priority Data

Nov. 5, 1998 (KR) .............................. 98-47338

(51) Int. Cl.$^7$ .............................. H01L 21/283
(52) U.S. Cl. ............... 438/396; 438/253; 438/785; 438/240; 438/3; 427/79
(58) Field of Search ............... 438/3, 240, 253, 438/396, 761, 686, 783, 784, 785, 778, FOR 220, FOR 395; 427/79, 100, 126.1

(56) References Cited

U.S. PATENT DOCUMENTS 5,972,179 A * 10/1999 Chittipeddi et al.
6,165,802 A * 12/2000 Cuchiaro et al.
6,171,934 B1 * 1/2001 Joshi et al.
6,188,098 B1 * 2/2001 Amanuma

* cited by examiner

*Primary Examiner*—George Fourson
*Assistant Examiner*—Joannie Adelle Garcia
(74) *Attorney, Agent, or Firm*—Roseman & Colin LLP.

(57) ABSTRACT

An inventive a method for manufacturing a microelectronic structure for use in computer memory applications, sensors, capacitors and various communications applications, the microelectronic structure including a stoichiometric ferroelectric and/or dielectric layer containing lead or bismuth formed on top of an electrode, the method comprising the steps of: forming a lower electrode; forming a self diffusion barrier on top of the lower electrode; heat-treating the self diffusion barrier at a first temperature; forming a ferroelectric and/or dielectric layer on top of the self diffusion barrier; heat-treating the ferroelectric and/or dielectric layer at a second temperature; and forming an upper electrode to thereby form the microelectronic structure, wherein a chemical composition of the self diffusion barrier is the same as that of the ferroelectric and/or dielectric layer after the second heat-treatment. The self diffusion barrier prevents the bismuth or lead component of the ferroelectric and/or dielectric layer from reacting and diffusing to the lower electrode and functions as a perovskite-seed layer for the ferroelectric and/or dielectric layer, making the ferroelectric and/or dielectric layer stoichiometric and lowering the crystallization temperature thereof.

16 Claims, 5 Drawing Sheets

METHOD FOR FORMING A STOICHIOMETRIC FERROELECTRIC AND/OR DIELECTRIC THIN FILM LAYER CONTAINING LEAD OR BISMUTH ON AN ELECTRODE

FIELD OF THE INVENTION

The present invention relates to a method for manufacturing a microelectronic structure including a ferroelectric and/or dielectric thin film layer containing lead or bismuth; and, more particularly, to a method for forming the ferroelectric and/or dielectric thin film layer including a self diffusion barrier at a bottom portion thereof on top of an electrode.

BACKGROUND OF THE INVENTION

Ferroelectric and/or dielectric thin film materials have been increasingly investigated for use in various electronic and electrooptical application. For example, thin films of ferroelectric and/or dielectric materials such as lead zirconate titanate (PZT) have been investigated for use in non-volatile computer memory applications, sensors, capacitors, piezoelectric devices and various communications applications.

The development of ferroelectric and/or dielectric thin-film materials may yield important advances in miniaturization of memory devices, higher capacity memory devices, true memory capacity, increased radiation hardness and very fast switching.

However, formation of the ferroelectric and/or dielectric thin films typically requires elevated temperature processing, which is not always conducive to integration with conventional silicon-wafer processing technologies, due to temperature limitations as to the stability of the underlying silicon wafer and/or structures thereon. For example, in the ferroelectric and/or dielectric materials containing Pb or Bi as a major constituent, Pb or Bi are extremely volatile and extremely reactive with electrodes at elevated temperatures if the electrodes are made of Pt, causing point defects in the form of vacancies to be formed therein and making the ferroelectric and/or dielectric materials non-stoichiometric. The point defects in the ferroelectric and/or dielectric thin film materials are detrimental because they promote severe polarization fatigue therein, making the ferroelectric and/or dielectric thin film material unsuitable for, e.g., computer memory applications.

Recently, interest has been exhibited in the layered perovskite phase of $Srbi_2Ta_2O_9$(SBT) for non-volatile ferroelectric memories, due to its ferroelectric properties such as polarization switching, low switching voltage, sufficiently large polarization and minimal tendency to imprint.

One important technique which has successfully produced SBT thin films is the metalloragnic decomposition (MOD) process wherein MOD precursor solutions of large soap-like derivatives (e.g. neo-decanonate carboxylic acid) of the starting metals, are utilized as both the ligand and the solvent. A notable advantage of the MOD strategy is that the chemical precursors, once formed and isolated, demonstrate minimal aging effects.

However, formation of the "soap" derivatives involves long reaction times at reflux temperatures and the extent of ligand exchange and in-situ generated reactive species can not be identified, which inhibits optimization of the precursor solution.

Also, the chemical stability of the MOD-formed precursors has a shortcoming that such stability limits the ability to "tailor" the properties of the low-reactivity starting compounds through reactions such as chelation, hydrolysis and condensation, thus restricting process flexibility and the ability to control the structural evolution of the thin film microstructures and heat treatment conditions.

Furthermore, high temperatures (800° C.) are required to convert the as-deposited MOD precursors to the desired layered perovskite phase. At such elevated temperatures, the electrode stack of a typical device for the ferroelectric materials exhibits severe instability and sublayer interaction problems, caused by Bi diffusing into the electrodes, this phenomena becoming more pronounced when the electrodes are made of platinum. A lot of different ideas have been proposed to solve this problem but to no avail.

SUMMARY OF THE INVENTION

It is, therefore, a primary object of the present invention to provide a method for manufacturing a microelectronic structure for use in non-volatile computer memory applications, sensors, capacitors and various communications applications, the microelectronic structure including a stoichiometric ferroelectric and/or dielectric layer containing Pb or Bi formed on top of an electrode.

In accordance with one aspect of the present invention, there is provided a method for manufacturing a microelectronic structure including a stoichiometric ferroelectric and/or dielectric thin film layer containing Pb or Bi formed on top of an electrode, the method comprising the steps of: forming a lower electrode; forming a self diffusion barrier on top of the lower electrode; heat-treating the self diffusion barrier at a first temperature; forming a ferroelectric and/or dielectric thin film layer on top of the self diffusion barrier; heat-treating the ferroelectric and/or dielectric thin film layer at a second temperature; and forming an upper electrode to thereby form the microelectronic structure, wherein a nominal chemical composition of the self diffusion barrier is the same as that of the ferroelectric and/or dielectric thin film layer after the heat-treatment of the ferroelectric and/or dielectric thin film layer.

BRIEF DESCRIPTION OF THE DRAWINGS

The above and other objects and features of the present invention will become apparent from the following description of the preferred embodiments given in conjunction with the accompanying drawings, wherein.

DETAILED DESCRIPTION OF THE PREFERRED EMBODIMENTS

Figure 1A:
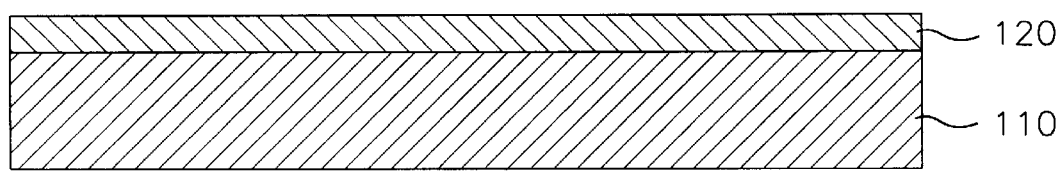
FIGS. 1A to 1F are cross sectional views illustrating a method for forming a ferroelectric and/or dielectric thin film layer on top of an electrode in a microelectronic structure in accordance with the present invention.

There are provided in FIGS. 1A to 1F and 2A to 2B cross sectional views illustrating a method for forming a ferroelectric and/or dielectric thin film layer in a microelectronic structure on top of an electrode in accordance with the present invention, and graphic representations of the hysteresis loop of the SBT ferroelectric layers formed using a conventional method and formed using the inventive method, respectively. It should be noted that like parts appearing in FIGS. 1A to 1F are represented by like reference numerals.

In accordance with the present invention, a following description and FIGS. 1A to 1F provides a method for forming a ferroelectric and/or dielectric thin film layer, such as stoichiometric strontium bismuth tantalate (SBT) thin film layer, in a microelectronic structure.

First, the manufacturing process begins with the formation of a lower electrode 120 on top of, for example, a substrate 110 by using a sputtering method, as shown in FIG. 1A, wherein the lower electrode 120 is made of a metal, e.g., platinum (Pt).

Subsequently, there are prepared a first and a second SBT precursor solutions by using a sol-gel method, the first and the second SBT precursor solutions being formed by: first preparing precursors, that is, strontium iso-propoxide, bismuth normal butoxide and tantalum ethoxide, and then mixing and stirring the precursors at a temperature of 60° C. for a time period of 1 hour. The first SBT precursor solution contains excess bismuth, whereas the second SBT precursor solution has the stoichiometric amount of bismuth, i.e., a mole-ratio of Sr:Bi:Ta being 1:2:2. To be more specific, the first SBT precursor solution is compounded to have 1–5 times the stoichiometric amount of bismuth, i.e., a mole-ratio of Sr:Bi:Ta being 1:2–10:2.

Figure 1B:
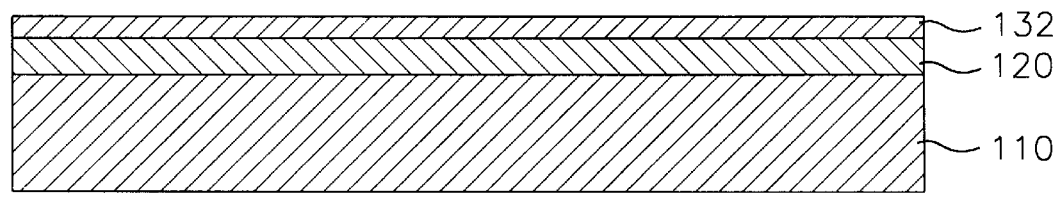

Subsequently, a first SBT layer 132 is formed on top of the lower electrode 120 by spin-coating the first precursor solution at a thickness of 50 Å–2500 Å at a 5000 rpm for a time period of 30 sec, and, then, drying at a temperature of about 300° C., as shown in FIG. 1B.

Figure 1C:
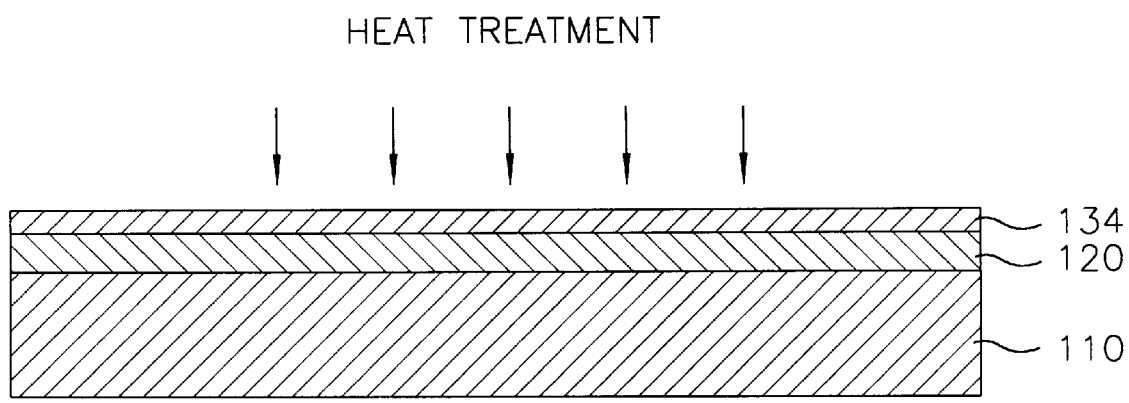

Thereafter, as shown in FIG. 1C, a self-diffusion barrier 134 is formed by heat-treating the first SBT layer 132 at a temperature between 300° C., the drying temperature, and 700° C., the crystallization temperature thereof, or by exposing the first SBT layer 132 to an ultraviolet radiation. The self diffusion barrier 134 will not only function as a protection layer for preventing bismuth in a ferroelectric layer 138 to be formed on top thereof from diffusing into the lower electrode 120 but also a perovskite seed layer for facilitating the growth of the SBT thin film layer 138.

Figure 1D:
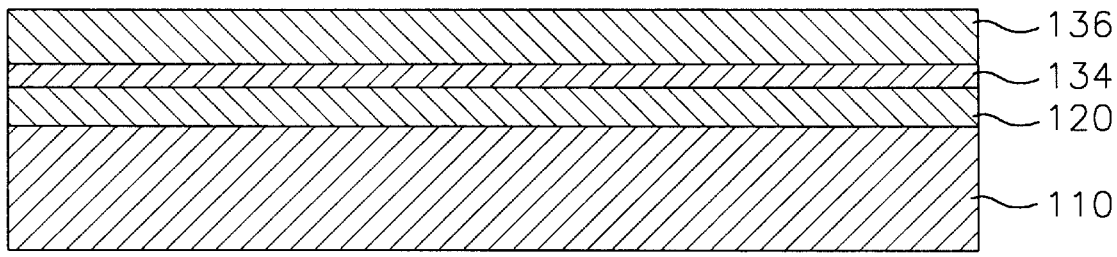

Next, a second SBT layer 136 is formed on top of the self diffusion barrier 134 by spin-coating the second precursor solution at a thickness of 100 Å–5000 Å at about 5000 rpm for a time period of 1 min.–5 min, and, then, drying it at a temperature of 300° C., as shown in FIG. 1D. The spin-coating and drying processes can be repeated several times in order to form a thick ferroelectric layer.

Figure 1E:
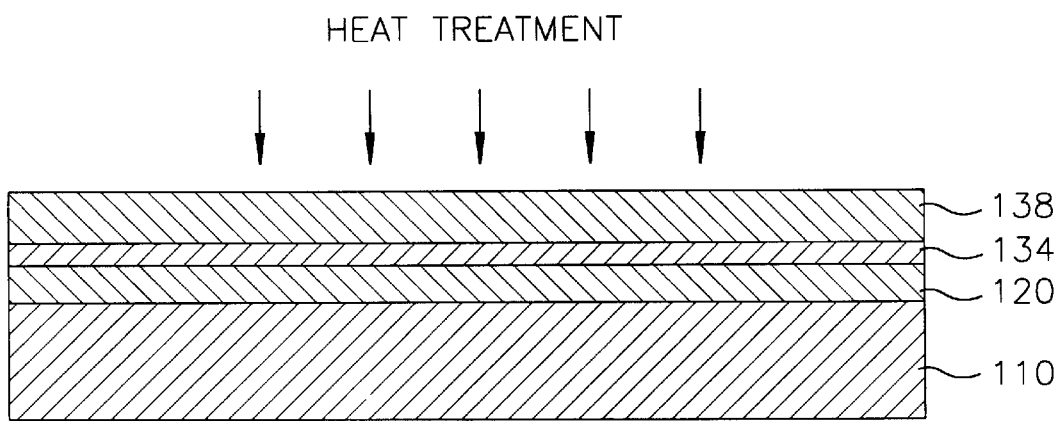

In a following step, the SBT thin film layer 138 is formed by heat-treating the second SBT layer 136 at a temperature below 750° C. or by exposing the second SBT layer 136 to an ultraviolet radiation, to allow the second SBT layer 136 to crystallize into a layered perovskite structure, as shown in FIG. 1E. The desirable crystallization temperature is experimentally determined to be in a range of 500° C.–750° C. It should be noted that the SBT thin film layer 138 and the self-diffusion barrier 134 have the identical chemical composition after the crystallization of the second SBT layer 136. Furthermore, since the components constituting of the self diffusion barrier 134 are same with those of the SBT thin film layer 138, the self diffusion barrier 134 can also be crystallized to have the layered perovskite structure by heat-treating the second SBT layer 136 at the crystallization temperature or by exposing the second SBT layer 136 to the ultraviolet radiation.

Figure 1F:
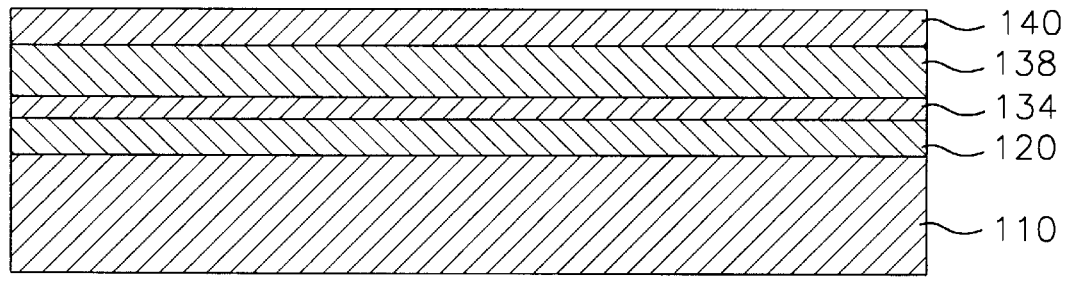

Finally, an upper electrode 140 made of the same material as the lower electrode 120 is formed on top of the SBT thin film layer 138 by using a sputtering method, as shown in FIG. 1F.

Figure 2A:
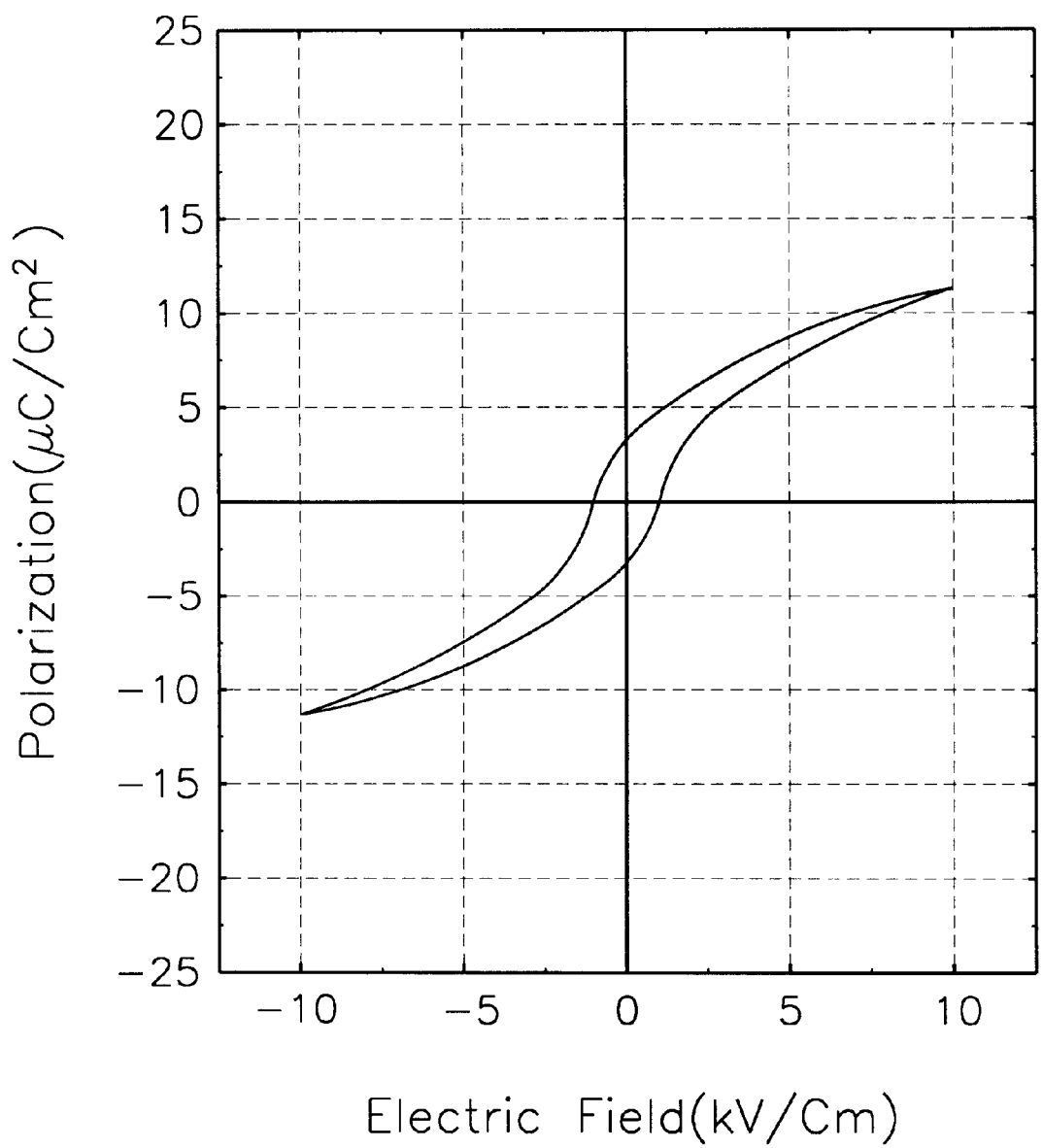
FIGS. 2A and 2B are graphic representations of the hysteresis loop of the SBT ferroelectric layers formed using a conventional method and the inventive method described in FIGS. 1A to 1F, respectively.
Figure 2B:
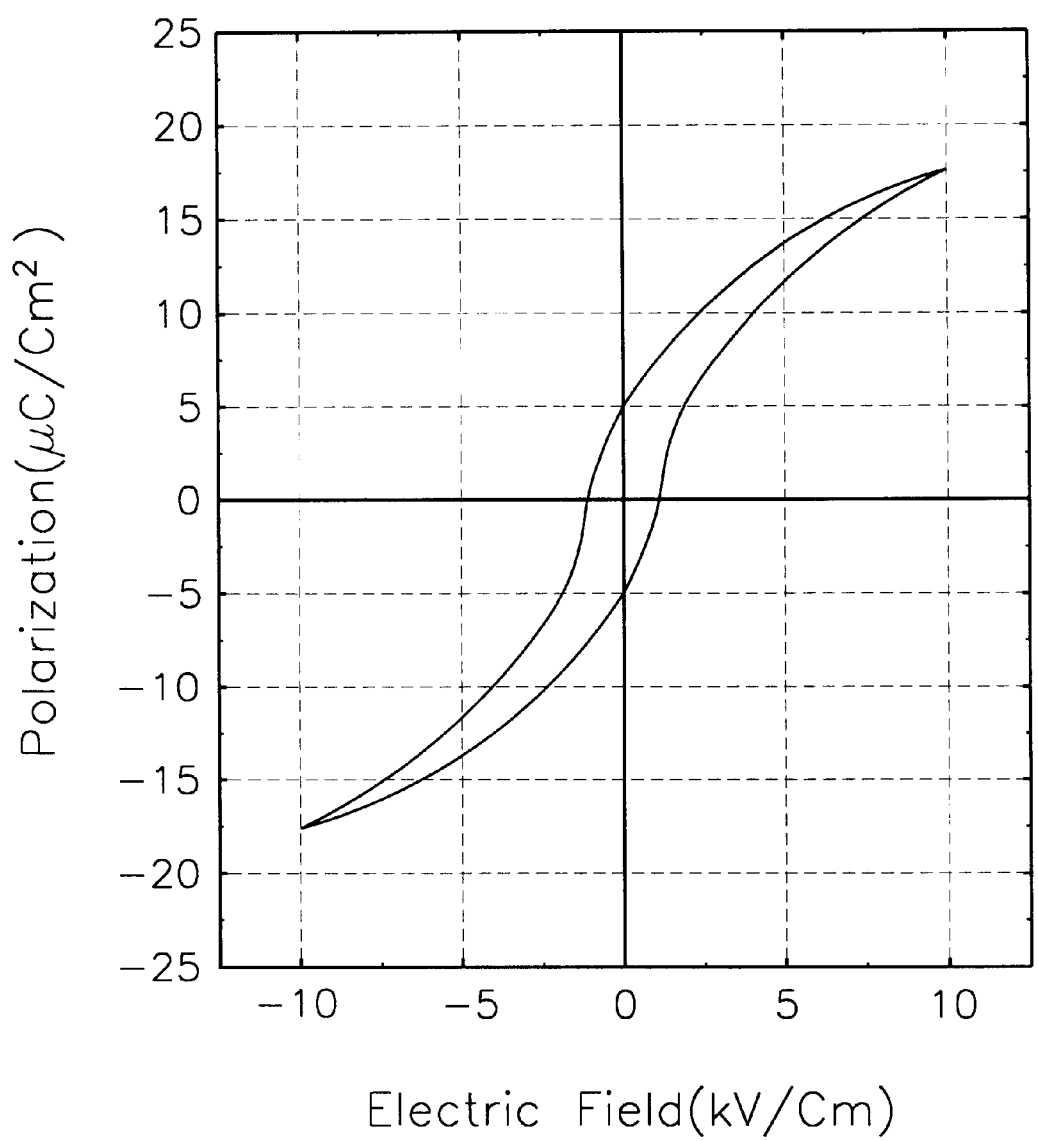

FIGS. 2A and 2B are graphic representations of the hysteresis loop of the SBT thin film layers formed without and with the self diffusion barrier, respectively. According to FIGS. 2A and 2B, the SBT thin film layer without the self diffusion barrier has a remanent polarization of about 3.2 $\mu C/cm^2$ and a coercive voltage of 1.0 kV/cm and the SBT thin film layer with the self diffusion barrier has a remanent polarization of about 5.0 $\mu C/cm^2$ and a coercive voltage of 0.9 kV/cm. As shown in FIGS. 2A and 2B, the remanent polarization in the SBT thin film layer with the self diffusion barrier is markedly higher than that of the SBT thin film layer without the self diffusion barrier.

A preferred embodiment has been described in detail hereinabove. It is to be understood that the scope of the invention also includes embodiments different from those described, yet within the scope of the claims. For example, PZT can be used as the ferroelectric and/or dielectric material, PZT including or representing all of the ferroelectric and/or dielectric materials containing lead while SBT including or representing all of the ferroelectric and/or dielectric materials containing bismuth.

In particular, the inventive method include the formation of a self diffusion barrier before the formation of the ferroelectric and/or dielectric thin film layer, the self diffusion barrier being formed by using spin-coating, drying, and heat-treating or annealing process. The self diffusion barrier of the present invention prevents bismuth or lead component of the ferroelectric and/or dielectric thin film layer from diffusing into the lower electrode, thereby preserving the stoichiometry in the ferroelectric and/or dielectric thin film layer. Furthermore, the self diffusion-barrier can also function as a perovskite-seed layer for the ferroelectric and/or dielectric thin film layer, resulting in lowering the crystallization temperature, and hence preventing thermal degradations in the microelectronic structure.

While the present invention has been described with respect to certain preferred embodiments only, other modifications and variations may be made without departing from the scope of the present invention as set forth in the following claims.

What is claimed is:

1. A method for manufacturing a microelectronic structure comprising the steps of:

forming a lower electrode;

forming a first ferroelectric and/or dielectric layer containing excess lead on top of the electrode;

heat-treating the first ferroelectric and/or dielectric layer at a first temperature to thereby form a self diffusion barrier;

forming a second ferroelectric and/or dielectric layer on top of the self diffusion barrier;

heat-treating the second ferroelectric and/or dielectric layer at a second temperature; and forming an upper electrode to thereby form the microelectronic structure, wherein chemical components of the self diffusion barrier are the same as those of the second ferroelectric and/or dielectric layer after the heat-treatment of the second ferroelectric and/or dielectric layer.

2. The method of claim 1, wherein the lower electrode is made of platinum.

3. The method of claim 1, wherein the first temperature for heat-treating the first ferroelectric and/or dielectric layer is a temperature between 300° C. and 700° C.

4. The method of claim 1, wherein the second temperature for heat-treating the second ferroelectric and/or dielectric layer is a temperature below 750° C.

5. The method of claim 1, wherein the first ferroelectric and/or dielectric layer has a thickness of 50 Å–2500 Å.

6. The method of claim 1, wherein the second ferroelectric and/or dielectric layer has a thickness of 100 Å–5000 Å.

7. A method for manufacturing a stoichiometric ferroelectric and/or dielectric layer on top of an electrode made of platinum in a microelectronic structure comprising the steps of:

forming a first ferroelectric and/or dielectric layer containing excess lead on top of the electrode;

crystallizing the first ferroelectric and/or dielectric layer to thereby form a self diffusion barrier;

forming a second ferroelectric and/or dielectric layer on top of the self diffusion barrier; and crystallizing the second ferroelectric and/or dielectric layer to thereby form a stoichiometric ferroelectric and/or dielectric layer, wherein chemical components of the self diffusion barrier are the same as those of the second ferroelectric and/or dielectric layer after the crystallization of the second ferroelectric and/or dielectric layer.

8. The method of claim 7, wherein the ferroelectric and/or dielectric material is a lead zerconate titanium (PZT).

9. The method of claim 7, wherein the step of crystallizing the first ferroelectric and/or dielectric layer includes an exposure to ultraviolet radiation.

10. The method of claim 7, wherein the step of crystallizing the second ferroelectric and/or dielectric layer includes an exposure to ultraviolet radiation.

11. A method for manufacturing a microelectronic structure comprising the steps of:

forming a lower electrode;

forming a first layer on top of the electrode, the first layer being made of a first ferroelectric and/or dielectric material;

heat-treating the first layer at a first temperature to thereby form a self diffusion barrier;

forming a second layer on top of the self diffusion barrier, the second layer being made of a second ferroelectric and/or dielectric material; and crystallizing the second layer at a second temperature; and forming an upper electrode to thereby form the microelectronic structure, wherein chemical components of the self diffusion barrier are the same as those of the second layer after the crystallization of the second layer, wherein the self diffusion barrier is crystallized during the step of crystallizing the second layer at the second temperature.

12. The method of claim 11, wherein the first and the second layers are made of materials containing lead or bismuth.

13. The method of claim 12, wherein the first and the second layers are a lead zirconate titanium (PZT) or a strontium bismuth tantalate (SBT).

14. The method of claim 13, wherein the first and the second layers contain excess lead or excess bismuth.

15. The method of claim 11, wherein the first temperature for heat-treating the first layer is a temperature between 300° C. and 700° C. and the second temperature for crystallizing the second layer is a temperature below 750° C.

16. The method of claim 11, wherein the first layer has a thickness of 50 Å–2500 Å and the second layer has a thickness of 100 Å–5000 Å.

* * * * *